(12) United States Patent
Lee

(10) Patent No.: US 9,991,327 B2
(45) Date of Patent: Jun. 5, 2018

(54) SEMICONDUCTOR DEVICE HAVING INDUCTOR

(71) Applicant: VIA TECHNOLOGIES, INC., New Taipei (TW)

(72) Inventor: Sheng-Yuan Lee, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days. days.

(21) Appl. No.: 15/440,082

(22) Filed: Feb. 23, 2017

(65) Prior Publication Data

US 2018/0012952 A1   Jan. 11, 2018

Related U.S. Application Data

(60) Provisional application No. 62/359,261, filed on Jul. 7, 2016.

(30) Foreign Application Priority Data

Jan. 13, 2017   (TW) .............................. 106101149 A

(51) Int. Cl.
| | |
|---|---|
| *H01L 29/00* | (2006.01) |
| *H01L 49/02* | (2006.01) |
| *H01L 23/528* | (2006.01) |
| *H01L 29/06* | (2006.01) |
| *H01L 23/522* | (2006.01) |

(52) U.S. Cl.
CPC ............ *H01L 28/10* (2013.01); *H01L 23/528* (2013.01); *H01L 23/5226* (2013.01); *H01L 23/5227* (2013.01); *H01L 29/0619* (2013.01)

(58) Field of Classification Search
CPC .... H01L 23/5227; H01L 23/528; H01L 28/10
USPC ......................................................... 257/531
See application file for complete search history.

(56) References Cited

U.S. PATENT DOCUMENTS

| 8,847,365 B2 | 9/2014 | Ellul et al. |
| 9,363,902 B2 | 6/2016 | Lo et al. |
| 9,431,473 B2 | 8/2016 | Lo et al. |

(Continued)

FOREIGN PATENT DOCUMENTS

| TW | 201131592 A1 | 9/2011 |
| TW | I459422 A | 7/2012 |

(Continued)

*Primary Examiner* — Matthew E Warren
(74) *Attorney, Agent, or Firm* — McClure, Qualey & Rodack, LLP

(57) ABSTRACT

A semiconductor device includes first and second winding portions disposed in a first level of an insulating layer and surrounding a center region thereof. Each of the winding portions includes conductive lines arranged from the inside to the outside. First and second extending conductive lines are disposed in the first level of the insulating layer. A third extending conductive line is disposed in a second level of the insulating layer. The first extending conductive line is coupled between the innermost conductive line of the second winding and the third extending conductive line. The second extending conductive line is coupled between the innermost conductive line of the first winding portion and the third extending conductive line. The first extending conductive line and the third extending conductive line coupled thereto are arranged in a helix or a spiral spatial configuration.

10 Claims, 9 Drawing Sheets

(56) References Cited

U.S. PATENT DOCUMENTS

| | | | |
|---|---|---|---|
| 2003/0137385 A1 | 7/2003 | Ahn et al. | |
| 2006/0181386 A1* | 8/2006 | Lee | H01F 17/0006 336/200 |
| 2007/0247269 A1* | 10/2007 | Papananos | H01F 27/2804 336/200 |
| 2009/0066457 A1* | 3/2009 | Uchida | H01F 27/2804 336/188 |
| 2009/0108978 A1 | 4/2009 | Loke et al. | |
| 2013/0285198 A1* | 10/2013 | Kihara | H01L 28/10 257/531 |
| 2017/0338791 A1* | 11/2017 | Akhtar | H01L 23/66 |
| 2017/0345559 A1* | 11/2017 | Vanukuru | H01F 27/346 |

FOREIGN PATENT DOCUMENTS

| | | |
|---|---|---|
| TW | I506654 A | 10/2013 |
| TW | 201351457 A | 12/2013 |
| TW | 201432739 A | 8/2014 |

* cited by examiner

SEMICONDUCTOR DEVICE HAVING INDUCTOR

CROSS REFERENCE TO RELATED APPLICATIONS

This application claims the benefit of U.S. Provisional Application No. 62/359,261, filed on Jul. 7, 2016 and claims priority of Taiwan Patent Application No. 106101149, filed on Jan. 13, 2017, the entirety of which is incorporated by reference herein.

BACKGROUND

Field of the Disclosure

The invention relates to a semiconductor device, and in particular to a semiconductor device having an inductor.

Description of the Related Art

Many digital/analog devices and circuits have been successfully applied to semiconductor integrated circuits. Such devices may include passive components, such as resistors, capacitors, or inductors. A typical semiconductor integrated circuit includes one or more dielectric layers disposed on a semiconductor substrate, and one or more metal layers disposed in the dielectric layers. The metal layers may be employed to form on-chip elements, such as on-chip inductors, using current semiconductor manufacturing technology.

An on-chip inductor is formed on a substrate and includes a metal layer. The metal layer surrounds from the outside to the inside with respect to a center region, and the metal layer closest to the center region further surrounds from the inside to the outside. Two ends of the metal layer are at the outermost coil thereof and each of the ends connects to an input/output portion. Moreover, the aforementioned on-chip inductor may further include a branch structure that is connected to the innermost coil of the metal layer.

An equivalent circuit composed of the two input/output portions and the branch structure of the aforementioned on-chip inductor is a T-coil. Circuit parameters of the T-coil include a first inductance, a second inductance and a coupling parameter. The first inductance value, the second inductance value and the coupling parameter value are usually adjusted by changing the location for connecting the innermost coil of the metal layer and the branch structure.

However, since the location for connecting the innermost coil of the metal layer and the branch structure is limited within a range of a side length of the innermost coil of the metal layer, the structure of the conventional on-chip inductor makes it difficult to meet various circuit-design demands.

Thus, there exists a need in the art for development of a semiconductor device having an inductor capable of mitigating or eliminating the aforementioned problems.

SUMMARY

An exemplary embodiment of a semiconductor device according to the invention is provided. The semiconductor device includes an insulating layer disposed over a substrate. The insulating layer has a center region. A first winding portion and a second winding portion, which are electrically connected to the first winding portion, are disposed in a first level of the insulating layer and surround the center region. Each of the first winding portion and the second winding portion includes a plurality of conductive lines arranged from the inside to the outside. A first extending conductive line and a second extending conductive line partially surround the first extending conductive line and are disposed in the first level of the insulating layer. The first winding portion and the second winding portion surround the first extending conductive line and the second extending conductive line. A third extending conductive line is disposed in a second level of the insulating layer and surrounds the center region. The extending conductive lines and the conductive lines have a first end and a second end. The first end and the second end of the first extending conductive line are respectively coupled to the first end of an innermost conductive line of the second winding portion and the first end of the third extending conductive line. The first end and the second end of the second extending conductive line are respectively coupled to the first end of an innermost conductive line of the first winding portion and the second end of the third extending conductive line. The first extending conductive line and the third extending conductive line coupled thereto are arranged in a helix or a spiral spatial configuration.

Another exemplary embodiment of a semiconductor device according to the invention is provided. The semiconductor device includes an insulating layer disposed over a substrate. The insulating layer has a center region. A first winding portion and a second winding portion, which are electrically connected to the first winding portion, are disposed in a first level of the insulating layer and surround the center region. Each of the first winding portion and the second winding portion includes a plurality of conductive lines arranged from the inside to the outside. A first extending conductive line and a second extending conductive line partially surround the first extending conductive line and are disposed in the first level of the insulating layer. The first winding portion and the second winding portion surround the first extending conductive line and the second extending conductive line. A third extending conductive line is disposed in a second level of the insulating layer and surrounds the center region. The extending conductive lines and the conductive lines have a first end and a second end. The first end and the second end of the first extending conductive line are respectively coupled to the first end of an innermost conductive line of the first winding portion and the second end of the third extending conductive line. The first end and the second end of the second extending conductive line are respectively coupled to the first end of an innermost conductive line of the second winding portion and the first end of the third extending conductive line. The first extending conductive line and the third extending conductive line coupled thereto are arranged in a helix or a spiral spatial configuration.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1A:
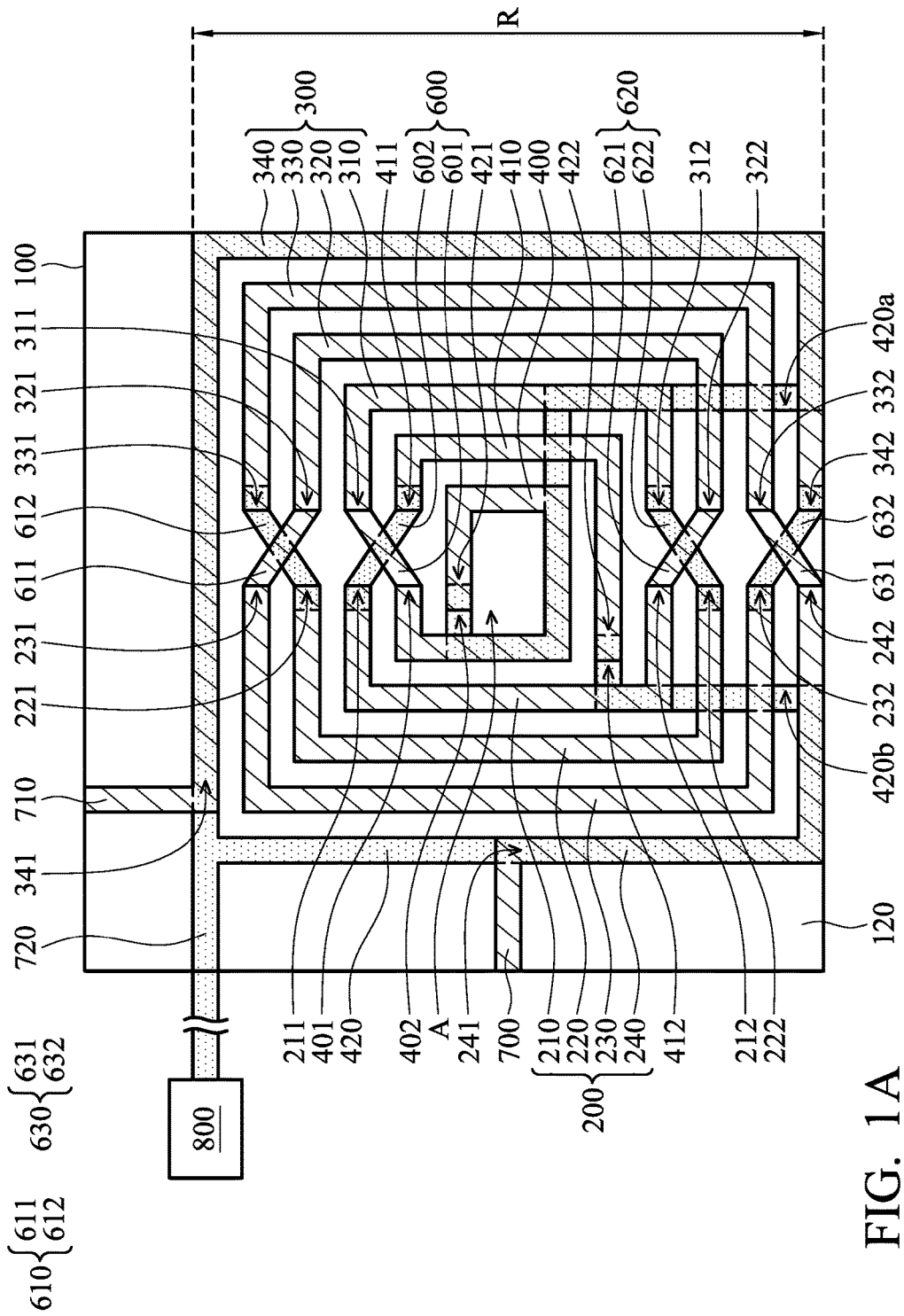
FIG. 1A is a plan view of an exemplary embodiment of a semiconductor device having an inductor according to the invention.

The following description is of the best-contemplated mode of carrying out the invention. This description is provided for the purpose of illustrating the general principles of the invention and should not be taken in a limiting sense. The scope of the invention is best determined by reference to the appended claims. Moreover, the same or similar elements in the drawings and the description are labeled with the same reference numbers.

Refer to FIG. 1A, which illustrates a plan view of an exemplary embodiment of a semiconductor device having an inductor according to the invention. In the embodiment, the semiconductor device having an inductor includes a substrate 100, such as a silicon substrate or other semiconductor substrates known in the art. The substrate 100 may include various elements, such as transistors, resistors, or other semiconductor elements known in the art.

In the embodiment, the semiconductor device further includes an insulating layer 120 disposed over the substrate 100. The insulating layer 120 has a center region A. Moreover, the insulating layer 120 may be a single dielectric layer (e.g., silicon oxide, silicon nitride, or low-k dielectric material) or a multi-layer dielectric structure.

In the embodiment, the semiconductor device further includes a first winding portion 200 and a second winding portion 300 electrically connected to the first winding portion 200, which are disposed in a first level of the insulating layer 120 and surround the center region A. In one embodiment, the first winding portion 200 and the second winding portion 300 respectively include conductive lines arranged from the inside to the outside. For example, the first winding portion 200 may include a first conductive line 210, a second conductive line 220, a third conductive line 230, and a fourth conductive line 240 arranged from the inside to the outside, as shown in FIG. 1A. Moreover, the second winding portion 300 may include a first conductive line 310, a second conductive line 320, a third conductive line 330, and a fourth conductive line 340 arranged from the inside to the outside and successively corresponding to the first conductive line 210, the second conductive line 220, the third conductive line 230, and the fourth conductive line 240. However, it should be understood that the number of the conductive lines is based on design demands and is not limited to the embodiment shown in FIG. 1A. In other embodiments, the first winding portion 200 and the second winding portion 300 may include 2, or may include more than 4 conductive lines arranged from the inside to the outside.

In the first winding portion 200, the first conductive line 210 has a first end 211 and a second end 212. The second conductive line 220 has a first end 221 and a second end 222. The third conductive line 230 has a first end 231 and a second end 232. The fourth conductive line 240 has a first end 241 and a second end 242. Moreover, in the second winding portion 300, the first conductive line 310 has a first end 311 and a second end 312. The second conductive line 320 has a first end 321 and a second end 322. The third conductive line 330 has a first end 331 and a second end 332. The fourth conductive line 340 has a first end 341 and a second end 342. In one embodiment, the first conductive line 210, the second conductive line 220, and the third conductive line 230 of the first winding portion 200 and the first conductive line 310, the second conductive line 320, and the third conductive line 330 of the second winding portion 300 corresponding thereto are arranged symmetrically. In one embodiment, the first winding portion 200 and the second winding portion 300 may substantially form a shape that is circular, rectangular, hexagonal, octagonal, or polygonal. To simplify the diagram, only an exemplary rectangular shape is depicted herein. Moreover, in one embodiment, the first conductive lines 210 and 310, the second conductive lines 220 and 320, the third conductive lines 230 and 330, and the fourth conductive lines 240 and 340 have the same line width.

In one embodiment, the first conductive lines 210 and 310, the second conductive lines 220 and 320, the third conductive lines 230 and 330, and the fourth conductive lines 240 and 340 comprise copper, aluminum, or an alloy thereof. In such cases, the first level is an uppermost level, so that the first conductive lines 210 and 310, the second conductive lines 220 and 320, the third conductive lines 230 and 330, and the fourth conductive lines 240 and 340 are formed of an uppermost metal layer.

In the embodiment, the semiconductor device further includes a first extending conductive line 400 and a second extending conductive line 410 that partially surrounds the first extending conductive line 400. The first extending conductive line 400 and the second extending conductive line 410 are disposed in the first level of the insulating layer 120 and the first and second winding portions 200 and 300 surround the first and second extending conductive lines 400 and 410. In one embodiment, the first extending conductive line 400 substantially surrounds the center region A and has a first end 401 and a second end 402. Moreover, the second extending conductive line 410 partially surrounds the center region A and has a first end 411 and a second end 412. Furthermore, in one embodiment, the first extending conductive line 400 and the second extending conductive line 410 have a line width that is the same as the line width of the first conductive lines 210 and 310, the second conductive lines 220 and 320, the third conductive lines 230 and 330, and the fourth conductive lines 240 and 340.

In one embodiment, the first extending conductive line 400 and the second extending conductive line 410 comprise copper, aluminum, or an alloy thereof. In such cases, the first extending conductive line 400 and the second extending conductive line 410 are formed of the uppermost metal layer.

In the embodiment, the semiconductor device further includes a coupling portion disposed in the insulating layer 120 between the first winding portions 200 and the second winding portions 300, so that the first winding portions 200 are electrically connected to the second winding portions

300. In one embodiment, the coupling portion includes a first pair of connection layers 600, a second pair of connection layers 610, a third pair of connection layers 620, and a fourth pair of connection layers 630. In one embodiment, the first pair of connection layers 600 includes an upper cross-connect layer 601 disposed in the first level of the insulating layer 120 and a lower cross-connect layer 602 disposed in a second level (below the first level) of the insulating layer 120. Moreover, the first end 311 of the innermost conductive line (i.e., the first conductive line 310) of the second winding portion 300 is connected to the first end 401 of the first extending conductive line 400 through the upper cross-connect layer 601. The first end 211 of the innermost conductive line (i.e., the first conductive line 210) of the first winding portion 200 is connected to the first end 411 of the second extending conductive line 410 through the lower cross-connect layer 602 and the conductive plugs (not shown) between the first level and the second level. The upper cross-connect layer 601 and the lower cross-connect layer 602 are arranged in a cross spatial configuration.

In one embodiment, the second pair of connection layers 610 includes an upper cross-connect layer 611 disposed in the first level of the insulating layer 120 and a lower cross-connect layer 612 disposed in the second level of the insulating layer 120. Moreover, the first end 321 of the second conductive line 320 is connected to the first end 231 of the third conductive line 230 through the upper cross-connect layer 611. The first end 221 of the second conductive line 220 is connected to the first end 311 of the third conductive line 330 through the lower cross-connect layer 612 and the conductive plugs (not shown) between the first level and the second level. The upper cross-connect layer 611 and the lower cross-connect layer 612 are arranged in a cross spatial configuration.

In one embodiment, the third pair of connection layers 620 includes an upper cross-connect layer 621 disposed in the first level of the insulating layer 120 and a lower cross-connect layer 622 disposed in the second level of the insulating layer 120. Moreover, the second end 212 of the first conductive line 210 is connected to the second end 322 of the second conductive line 320 through the upper cross-connect layer 621. The second end 312 of the first conductive line 310 is connected to the second end 222 of the second conductive line 220 through the lower cross-connect layer 622 and the conductive plugs (not shown) between the first level and the second level. The upper cross-connect layer 621 and the lower cross-connect layer 622 are arranged in a cross spatial configuration.

In one embodiment, the fourth pair of connection layers 630 includes an upper cross-connect layer 631 disposed in the first level of the insulating layer 120 and a lower cross-connect layer 632 disposed in the second level of the insulating layer 120. Moreover, the second end 332 of the third conductive line 330 is connected to the second end 242 of the fourth conductive line 240 through the upper cross-connect layer 621. The second end 232 of the third conductive line 230 is connected to the second end 342 of the fourth conductive line 340 through the lower cross-connect layer 632 and the conductive plugs (not shown) between the first level and the second level. The upper cross-connect layer 631 and the lower cross-connect layer 632 are arranged in a cross spatial configuration.

In one embodiment, the upper cross-connect layers 601, 611, 621, and 631 and the lower cross-connect layers 602, 612, 622, and 632 may comprise metal, such as copper, aluminum, or an alloy thereof.

In the embodiment, the semiconductor device further includes a third extending conductive line 420, which is disposed in the second level of the insulating layer 120 and surrounds the center region A. Moreover, in one embodiment, the third extending conductive line 420 has a line width that is the same as those of the first extending conductive line 400 and the second extending conductive line 410. In such cases, portions of the third extending conductive line 420 correspond to and are positioned directly below the fourth conductive lines 240 and 340, so that the fourth conductive lines 240 and 340 extend along and overlap the third extending conductive line 420. Moreover, the third extending conductive line 420 has connection portions 420a and 420b that respectively extend below the first extending conductive line 400 and the second extending conductive line 410.

In one embodiment, the third extending conductive line 420 has a first end 421 correspondingly connected to one end of the connection portion 420a, and has a second end 422 correspondingly connected to one end of the connection portion 420b. In this case, the first end 421 of the third extending conductive line 420 is coupled to the second end 402 of the first extending conductive line 400, and the second end 422 of the third extending conductive line 420 is coupled to the second end 412 of the second extending conductive line 410. For example, the first end 421 of the third extending conductive line 420 is connected to the second end 402 of the first extending conductive line 400 through the conductive plugs (not shown) between the first level and the second level. The second end 422 of the third extending conductive line 420 is connected to the second end 412 of the second extending conductive line 410 through the conductive plugs (not shown) between the first level and the second level. In the embodiment, as viewed from a top-view aspect, after the first end 421 of the third extending conductive line 420 is connected to the second end 402 of the first extending conductive line 400 through the conductive plugs (not shown) between the first level and the second level, a portion of the connection portion 420a of the third extending conductive line 420 extends along the first extending conductive line 400, so as to be correspondingly arranged below the first extending conductive line 400 (i.e., in the second level). In other words, as viewed from a top-view aspect, the portion of the connection portion 420a of the third extending conductive line 420 overlaps a portion of the first extending conductive line 400, such that the portion of the connection portion 420a of the third extending conductive line 420 and the overlying first extending conductive line 400 are arranged in a helix spatial configuration. In one embodiment, the third extending conductive line 420 comprises copper, aluminum, or an alloy thereof.

In the embodiment, the semiconductor device further includes first and second input/output portions 700 and 710 disposed in the first level of the insulating layer 120 and a third input/output portion 720 (which is also referred to as a branch structure) disposed in the second level of the insulating layer 120. In one embodiment, the first input/output portion 700 extends outward from the first end 241 of the outermost conductive line (i.e., the fourth conductive line 240) of the first winding portion 200. The second input/output portion 710 extends outward from the first end 341 of the outermost conductive line (i.e., the fourth conductive line 340) of the second winding portion 300. The third input/output portion 710 extends outward from the third extending conductive line 420.

In one embodiment, as viewed from a top-view aspect, the first input/output portion 700 and the second input/output portion 710 are not parallel to each other. For example, the first input/output portion 700 and the second input/output portion 710 are perpendicular to each other. In this case, the third input/output portion 720 may be parallel to the first input/output portion 700 or the second input/output portion 710. In other embodiments, as viewed from a top-view aspect, the first input/output portion 700 and the second input/output portion 710 are parallel to each other. In this case, the third input/output portion 720 may be parallel to or perpendicular to the first input/output portion 700 and the second input/output portion 710.

In the embodiment, the locations of the first input/output portion 700 and the second input/output portion 710 may be changed by adjusting the length of the fourth conductive lines 240 and 340 and is not limited to the locations shown in FIG. 1A. Moreover, the third input/output portion 720 may be arranged within a tuning range R according to different demands and is not limited to the location shown in FIG. 1A. In one embodiment, the third input/output portion 720 may be connected to an electrostatic discharge device 800.

In the design process, since the conductive lines (e.g., the uppermost conductive lines) of the first and second winding portions 200 and 300 in the first level of the insulating layer 120 have thicknesses typically greater than that of the conductive line (e.g., the third extending conductive line 420) in the second level of the insulating layer 120, conductor loss is increased. Accordingly, in one embodiment, the semiconductor device further includes a multi-layer interconnect structure (not shown) below the second level of the insulating layer 120. The multi-layer interconnect structure may be connected to the third conductive line 420 through at least two conductive plugs (not shown).

The multi-layer interconnect structure may include multiple conductive layers and conductive plugs between the conductive layers, be disposed between the third conductive line 420 and the substrate 100, and overlap the third conductive line 420, so as to improve the quality of the inductor.

Figure 1B:
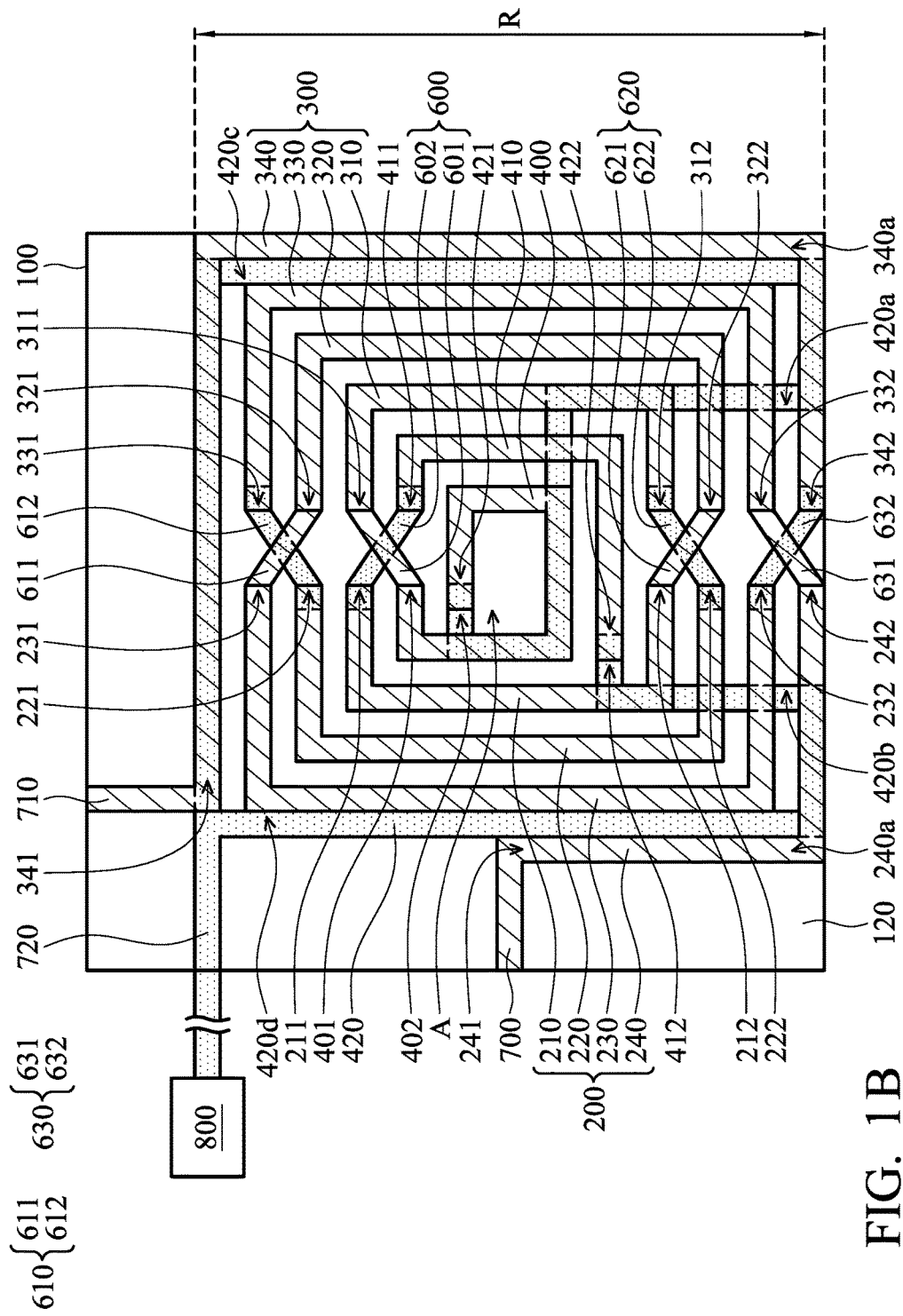
FIG. 1B is a plan view of an exemplary embodiment of a semiconductor device having an inductor according to the invention.

FIG. 1B illustrates a plan view of an exemplary embodiment of a semiconductor device having an inductor according to the invention. Elements in FIG. 1B that are the same as those in FIG. 1A are labeled with the same reference numbers as in FIG. 1A and are not described again. In the embodiment, the semiconductor device having an inductor is similar to the semiconductor device having an inductor shown in FIG. 1A. However, in the embodiment, as viewed from a top-view aspect, a portion 240a of the fourth conductive line 240 that extends along the third extending conductive line 420 is laterally shifted with respect to a portion 420d of the third extending conductive line 420. A portion 340a of the fourth conductive line 340 that extends along the third extending conductive line 420 is laterally shifted with respect to a portion 420c of the third extending conductive line 420. In one embodiment, as viewed from a top-view aspect, the portion 240a of the fourth conductive line 240 does not overlap the corresponding portion 420d of the third extending conductive line 420 and the portion 340a of the fourth conductive line 340 does not overlap the corresponding portion 420c of the third extending conductive line 420, as shown in FIG. 1B. As a result, the coupling parameter (k) of the inductor in FIG. 1B is less than the coupling parameter (k) of the inductor in FIG. 1A. In the embodiment, as viewed from a top-view aspect, the portion 420d of the third extending conductive line 420 is located between the corresponding portion 240a of the fourth conductive line 240 and the corresponding third conductive line 230. The portion 420c of the third extending conductive line 420 is located between the corresponding portion 340a of the fourth conductive line 340 and the corresponding third conductive line 330.

In other embodiments, as viewed from a top-view aspect, the portion 240a of the fourth conductive line 240 partially overlaps the corresponding portion 420d of the third extending conductive line 420 and the portion 340a of the fourth conductive line 340 partially overlaps the corresponding portion 420c of the third extending conductive line 420. As a result, the coupling parameter (k) of the inductor in this configuration is less than the coupling parameter (k) of the inductor in FIG. 1A and greater than the coupling parameter (k) of the inductor in FIG. 1B. Accordingly, the desired coupling parameter (k) of the inductor can be obtained by adjusting the amount of overlap.

Figure 2A:
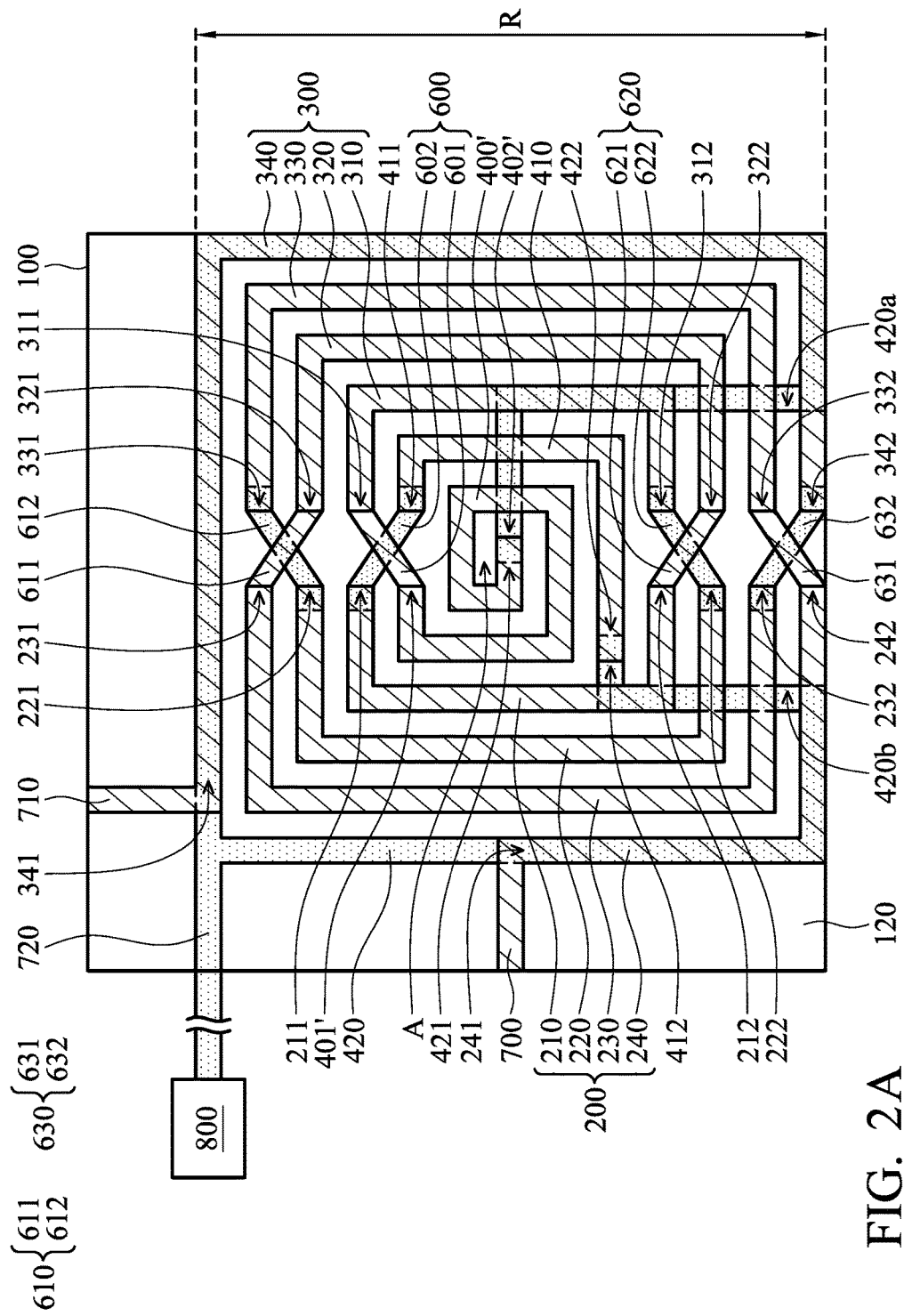
FIG. 2A is a plan view of an exemplary embodiment of a semiconductor device having an inductor according to the invention.

FIG. 2A illustrates a plan view of an exemplary embodiment of a semiconductor device having an inductor according to the invention. Elements in FIG. 2A that are the same as those in FIG. 1A are labeled with the same reference numbers as in FIG. 1A and are not described again. In the embodiment, the semiconductor device having an inductor is similar to the semiconductor device having an inductor shown in FIG. 1A. However, in the embodiment, as viewed from a top-view aspect, unlike the helix spatial configuration formed by the first extending conductive line 400 and the third extending conductive line 420 in FIG. 1A, after the first end 421 of the third extending conductive line 420 is connected to the second end 402' of the first extending conductive line 400' through conductive plugs (not shown) between the first level and the second level, a portion of the connection portion 420a of the third extending conductive line 420 does not extend along the first extending conductive line 400'. In other words, as viewed from a top-view aspect, a portion of the connection portion 420a of the third extending conductive line 420 crosses a portion of the first extending conductive line 400', so that the portion of the connection portion 420a of the third extending conductive line 420 and the overlying first extending conductive line 400' are arranged in a spiral spatial configuration. Similarly, the first extending conductive line 400' substantially surrounds the center region A and has a first end 401' and a second end 402'. Moreover, the first end 311 of the innermost conductive line (i.e., the first conductive line 310) of the second winding portion 300 is connected to the first end 401' of the first extending conductive line 400' through the upper cross-connect layer 601 of the first pair of connection layers 600. The first end 421 of the third extending conductive line 420 is connected to the second end 402' of the first extending conductive line 400' through the conductive plugs (not shown) between the first level and the second level.

Figure 2B:
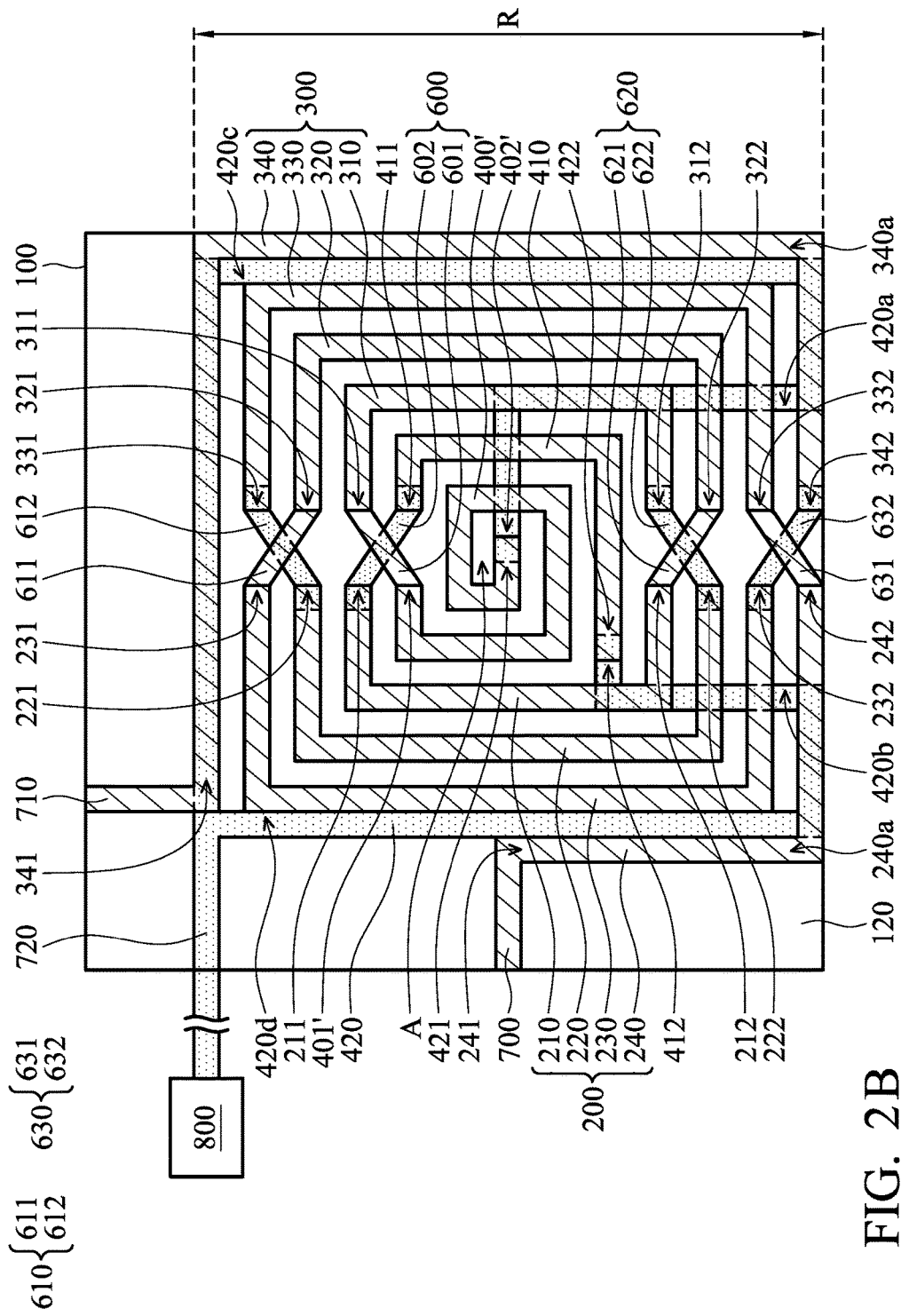
FIG. 2B is a plan view of an exemplary embodiment of a semiconductor device having an inductor according to the invention.

FIG. 2B illustrates a plan view of an exemplary embodiment of a semiconductor device having an inductor according to the invention. Elements in FIG. 2B that are the same as those in FIG. 2A are labeled with the same reference numbers as in FIG. 2A and are not described again. In the embodiment, the semiconductor device having an inductor is similar to the semiconductor device having an inductor shown in FIG. 2A. However, in the embodiment, as viewed from a top-view aspect, a portion 240a of the fourth conductive line 240 that extends along the third extending conductive line 420 is laterally shifted with respect to a portion 420d of the third extending conductive line 420. A portion 340a of the fourth conductive line 340 that extends along the third extending conductive line 420 is laterally shifted with respect to a portion 420c of the third extending conductive line 420. The portion 240a of the fourth conductive line 240 may not overlap (as shown in FIG. 2B) or may partially overlap the corresponding portion 420d of the third extending conductive line 420. Similarly, the portion 340a of the fourth conductive line 340 may not overlap (as shown in FIG. 2B) or may partially overlap the corresponding portion 420c of the third extending conductive line 420. In the embodiment, as viewed from a top-view aspect, the portion 420d of the third extending conductive line 420 is located between the corresponding portion 240a of the fourth conductive line 240 and the corresponding third conductive line 230. The portion 420c of the third extending conductive line 420 is located between the corresponding portion 340a of the fourth conductive line 340 and the corresponding third conductive line 330.

Figure 3A:
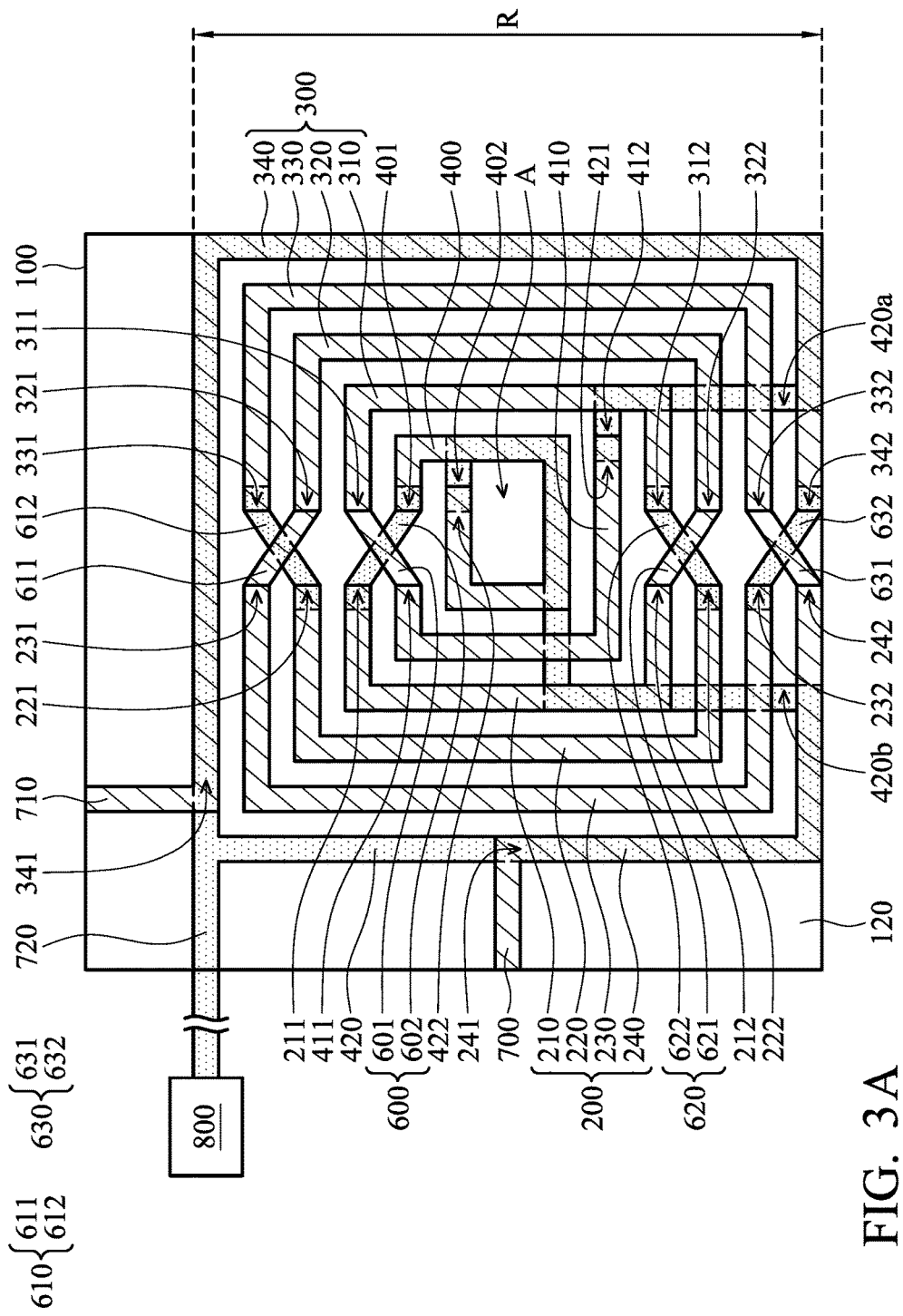
FIG. 3A is a plan view of an exemplary embodiment of a semiconductor device having an inductor according to the invention.

FIG. 3A illustrates a plan view of an exemplary embodiment of a semiconductor device having an inductor according to the invention. Elements in FIG. 3A that are the same as those in FIG. 1A are labeled with the same reference numbers as in FIG. 1A and are not described again. In the embodiment, the semiconductor device having an inductor is similar to the semiconductor device having an inductor shown in FIG. 1A. However, in the embodiment, unlike the configuration of the first extending conductive line 400 and the second extending conductive line 410 in FIG. 1A, the first end 311 of the innermost conductive line (i.e., the first conductive line 310) of the second winding portion 300 is connected to the first end 411 of the second extending conductive line 410 through the upper cross-connect layer 601 of the first pair of connection layers 600. The first end 211 of the innermost conductive line (i.e., the first conductive line 210) of the first winding portion 200 is connected to the first end 401 of the first extending conductive line 400 through the lower cross-connect layer 602 and the conductive plugs (not shown) between the first level and the second level. Moreover, the first end 421 and the second end 422 of the third extending conductive line 420 are respectively connected to the second end 412 of the second extending conductive line 410 and the second end 402 of the first extending conductive line 400t through the conductive plugs (not shown) between the first level and the second level. In the embodiment, as viewed from a top-view aspect, after the second end 422 of the third extending conductive line 420 is connected to the second end 402 of the first extending conductive line 400 through the conductive plugs (not shown) between the first level and the second level, a portion of the connection portion 420b of the third extending conductive line 420 extends along the first extending conductive line 400, so as to be correspondingly arranged below the first extending conductive line 400 (i.e., in the second level). In other words, as viewed from a top-view aspect, the portion of the connection portion 420b of the third extending conductive line 420 overlaps a portion of the first extending conductive line 400, such that the portion of the connection portion 420b of the third extending conductive line 420 and the overlying first extending conductive line 400 are arranged in a helix spatial configuration.

Figure 3B:
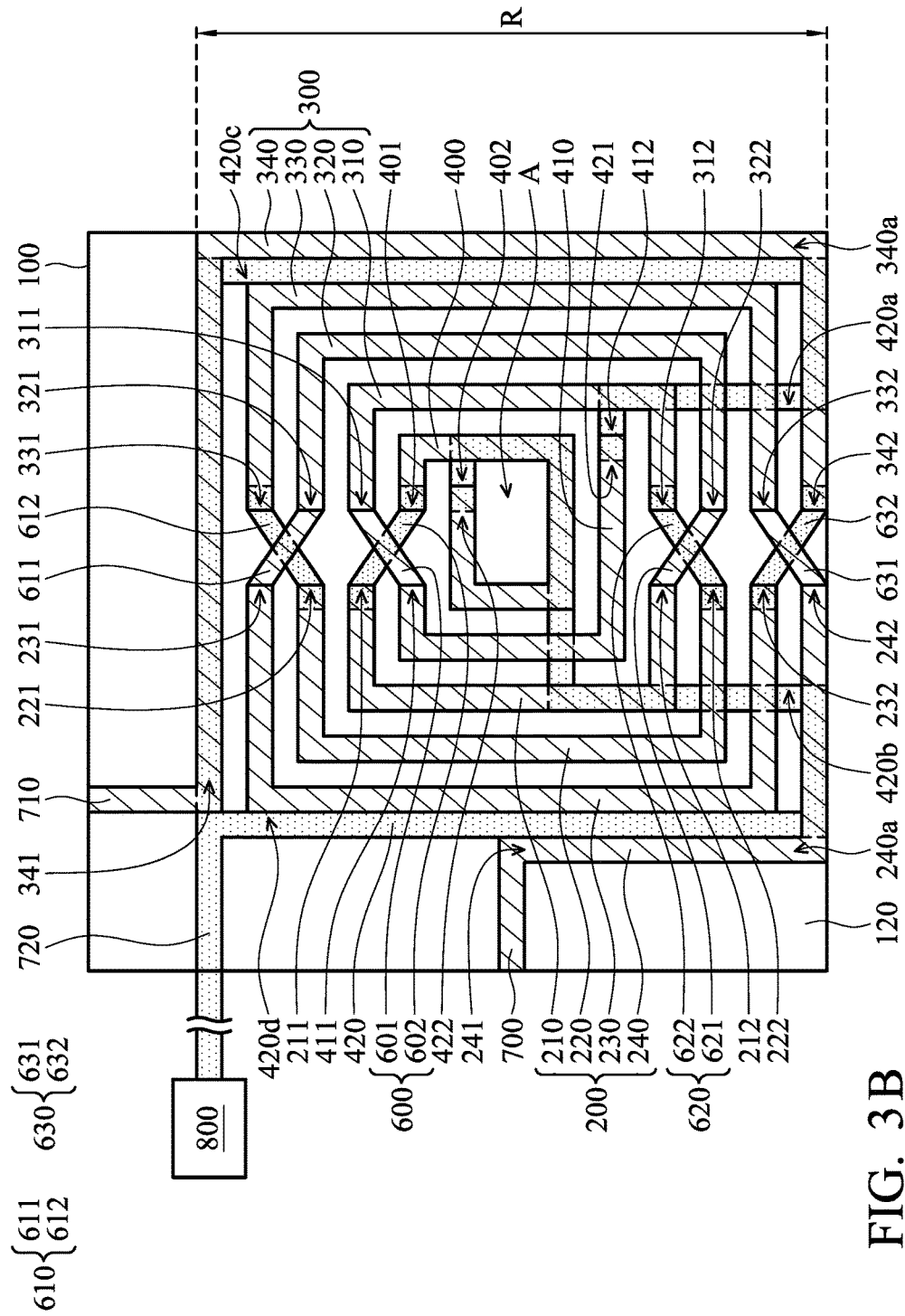
FIG. 3B is a plan view of an exemplary embodiment of a semiconductor device having an inductor according to the invention.

FIG. 3B illustrates a plan view of an exemplary embodiment of a semiconductor device having an inductor according to the invention. Elements in FIG. 3B that are the same as those in FIG. 3A are labeled with the same reference numbers as in FIG. 3A and are not described again. In the embodiment, the semiconductor device having an inductor is similar to the semiconductor device having an inductor shown in FIG. 3A. However, in the embodiment, as viewed from a top-view aspect, a portion 240a of the fourth conductive line 240 that extends along the third extending conductive line 420 is laterally shifted with respect to a portion 420d of the third extending conductive line 420. A portion 340a of the fourth conductive line 340 that extends along the third extending conductive line 420 is laterally shifted with respect to a portion 420c of the third extending conductive line 420. The portion 240a of the fourth conductive line 240 may not overlap (as shown in FIG. 3B) or may partially overlap the corresponding portion 420d of the third extending conductive line 420. Similarly, the portion 340a of the fourth conductive line 340 may not overlap (as shown in FIG. 3B) or may partially overlap the corresponding portion 420c of the third extending conductive line 420. In the embodiment, as viewed from a top-view aspect, the portion 420d of the third extending conductive line 420 is located between the corresponding portion 240a of the fourth conductive line 240 and the corresponding third conductive line 230. The portion 420c of the third extending conductive line 420 is located between the corresponding portion 340a of the fourth conductive line 340 and the corresponding third conductive line 330.

Figure 4A:
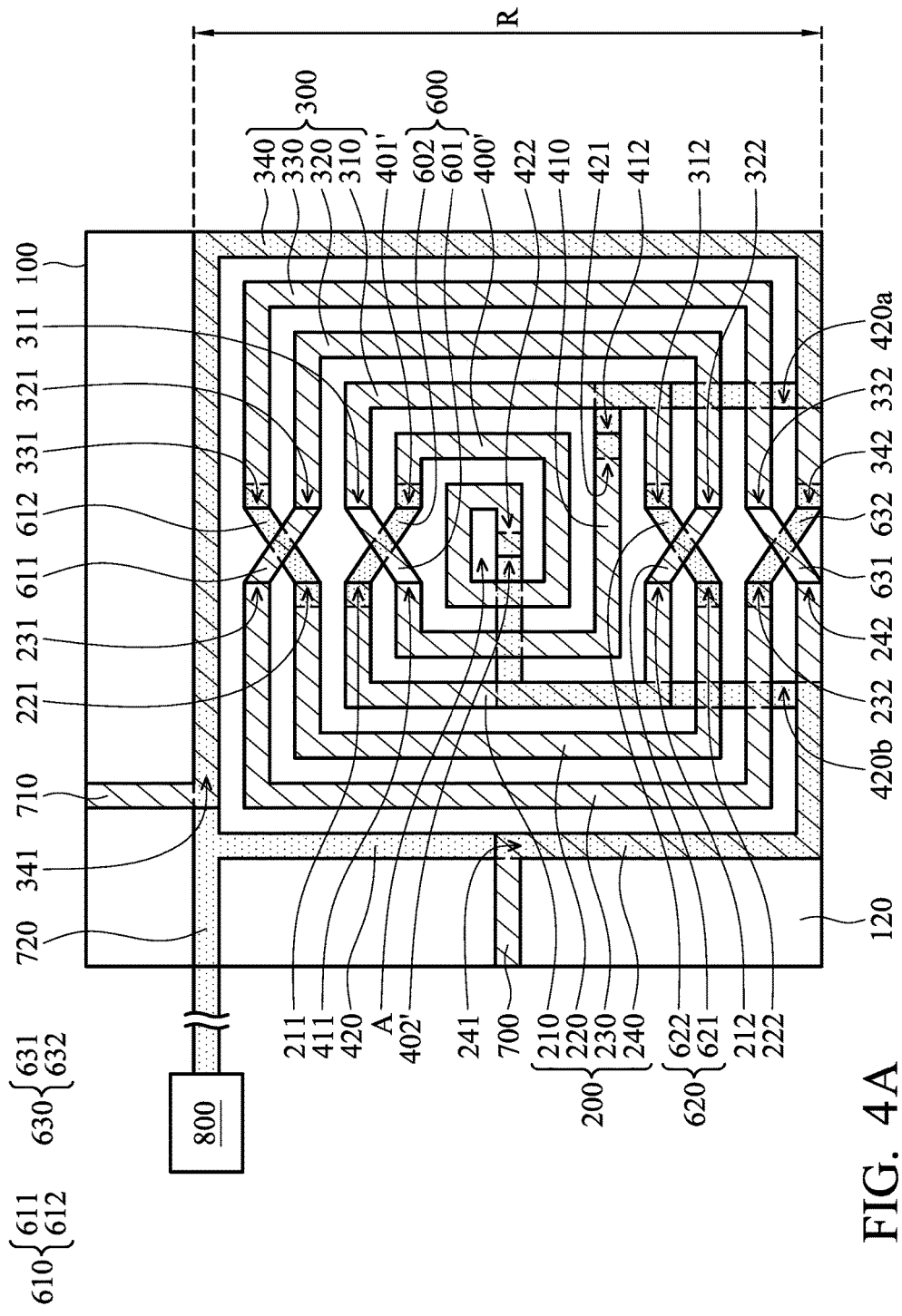
FIG. 4A is a plan view of an exemplary embodiment of a semiconductor device having an inductor according to the invention.

FIG. 4A illustrates a plan view of an exemplary embodiment of a semiconductor device having an inductor according to the invention. Elements in FIG. 4A that are the same as those in FIG. 3A are labeled with the same reference numbers as in FIG. 3A and are not described again. In the embodiment, the semiconductor device having an inductor is similar to the semiconductor device having an inductor shown in FIG. 3A. However, in the embodiment, as viewed from a top-view aspect, unlike the helix spatial configuration formed by the first extending conductive line 400 and the third extending conductive line 420 in FIG. 3A, after the second end 422 of the third extending conductive line 420 is connected to the second end 402' of the first extending conductive line 400' through conductive plugs (not shown) between the first level and the second level, a portion of the connection portion 420b of the third extending conductive line 420 does not extend along the first extending conductive line 400'. In other words, as viewed from a top-view aspect, a portion of the connection portion 420b of the third extending conductive line 420 crosses a portion of the first extending conductive line 400', so that the portion of the connection portion 420b of the third extending conductive line 420 and the overlying first extending conductive line 400' are arranged in a spiral spatial configuration. Similarly, the first extending conductive line 400' substantially surrounds the center region A and has a first end 401' and a second end 402'. Moreover, the first end 211 of the innermost conductive line (i.e., the first conductive line 210) of the first winding portion 200 is connected to the first end 401' of the first extending conductive line 400' through the upper cross-connect layer 601 of the first pair of connection layers 600. The second end 422 of the third extending conductive line 420 is connected to the second end 402' of the first extending conductive line 400' through the conductive plugs (not shown) between the first level and the second level.

Figure 4B:
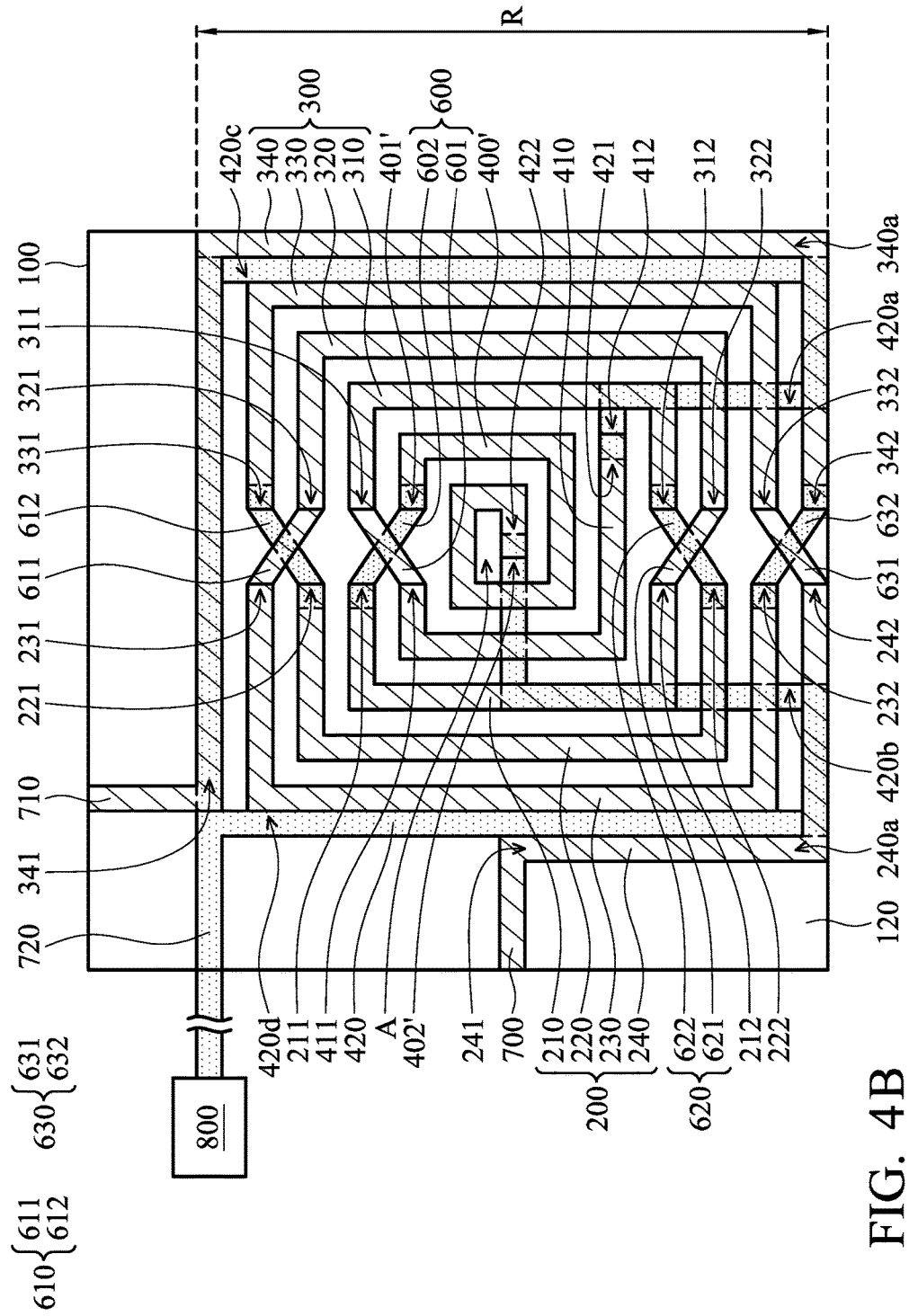
FIG. 4B is a plan view of an exemplary embodiment of a semiconductor device having an inductor according to the invention.

FIG. 4B illustrates a plan view of an exemplary embodiment of a semiconductor device having an inductor according to the invention. Elements in FIG. 4B that are the same as those in FIG. 4A are labeled with the same reference numbers as in FIG. 4A and are not described again. In the embodiment, the semiconductor device having an inductor is similar to the semiconductor device having an inductor shown in FIG. 4A. However, in the embodiment, as viewed from a top-view aspect, a portion 240a of the fourth conductive line 240 that extends along the third extending conductive line 420 is laterally shifted with respect to a portion 420d of the third extending conductive line 420. A portion 340a of the fourth conductive line 340 that extends along the third extending conductive line 420 is laterally shifted with respect to a portion 420c of the third extending conductive line 420. The portion 240a of the fourth conductive line 240 may not overlap (as shown in FIG. 4B) or may partially overlap the corresponding portion 420d of the third extending conductive line 420. Similarly, the portion 340a of the fourth conductive line 340 may not overlap (as shown in FIG. 4B) or may partially overlap the corresponding portion 420c of the third extending conductive line 420. In the embodiment, as viewed from a top-view aspect, the portion 420d of the third extending conductive line 420 is located between the corresponding portion 240a of the fourth conductive line 240 and the corresponding third conductive line 230. The portion 420c of the third extending conductive line 420 is located between the corresponding portion 340a of the fourth conductive line 340 and the corresponding third conductive line 330.

Figure 5:
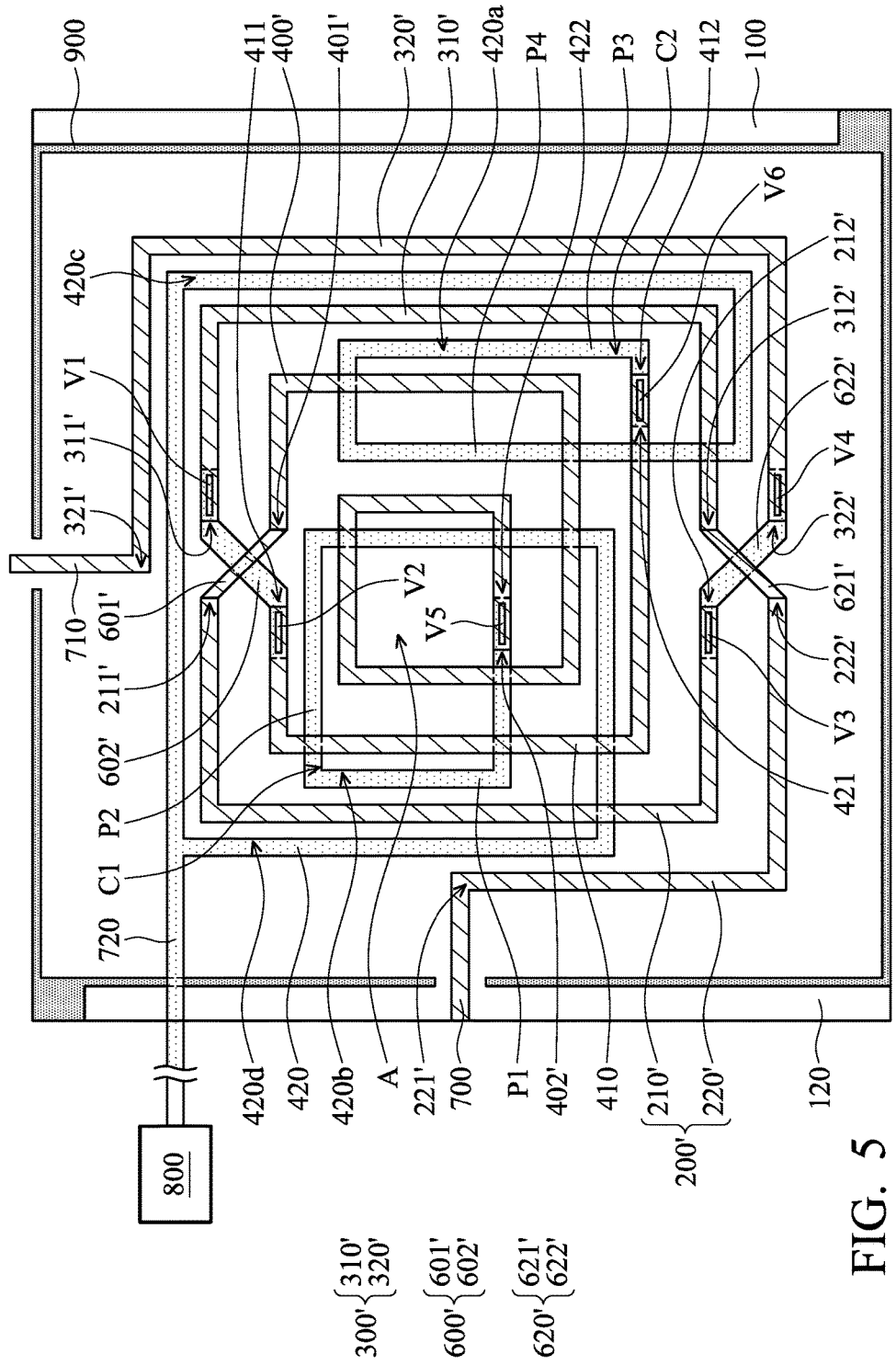
FIG. 5 is a plan view of an exemplary embodiment of a semiconductor device having an inductor according to the invention.

FIG. 5 illustrates a plan view of an exemplary embodiment of a semiconductor device having an inductor according to the invention. Elements in FIG. 5 that are the same as those in FIG. 4B are labeled with the same reference numbers as in FIG. 4B and are not described again. In the embodiment, the semiconductor device having an inductor is similar to the semiconductor device having an inductor shown in FIG. 4B. However, in the embodiment, the first winding portion 200' includes a first conductive line 210' and a second conductive line 220' arranged from the inside to the outside. Moreover, the second winding portion 300' includes a first conductive line 310' and a second conductive line 320' arranged from the inside to the outside. Similarly, in the first winding portion 200', the first conductive line 210' has a first end 211' and a second end 212'. The second conductive line 220' has a first end 221' and a second end 222'. Moreover, in the second winding portion 300', the first conductive line 310' has a first end 311' and a second end 312'. The second conductive line 320' has a first end 321' and a second end 322'.

In the embodiment, the semiconductor device further includes a coupling portion disposed in the insulating layer 120 between the first winding portions 200' and the second winding portions 300', so that the first winding portions 200' are electrically connected to the second winding portions 300'. In one embodiment, the coupling portion includes a first pair of connection layers 600' and a second pair of connection layers 620'. In one embodiment, the first pair of connection layers 600' includes an upper cross-connect layer 601' and a lower cross-connect layer 602'. Moreover, the first end 311' of the innermost conductive line (i.e., the first conductive line 310') of the second winding portion 300' is connected to the first end 411 of the second extending conductive line 410 through the lower cross-connect layer 602' and the conductive plugs V1 and V2 between the first level and the second level. The first end 211' of the innermost conductive line (i.e., the first conductive line 210') of the first winding portion 200' is connected to the first end 401' of the first extending conductive line 400' through the upper cross-connect layer 601'. The upper cross-connect layer 601' and the lower cross-connect layer 602' are arranged in a cross spatial configuration.

The second pair of connection layers 620' includes an upper cross-connect layer 621' and a lower cross-connect layer 622'. Moreover, the second end 312' of the first conductive line 310' is connected to the second end 222' of the second conductive line 220' through the upper cross-connect layer 621'. The second end 212' of the first conductive line 210' is connected to the second end 322' of the second conductive line 320' through the lower cross-connect layer 622' and the conductive plugs V3 and V4 between the first level and the second level. The upper cross-connect layer 621' and the lower cross-connect layer 622' are arranged in a cross spatial configuration.

The third extending conductive line 420 has a first end 421 correspondingly connected to one end of the connection portion 420a, and has a second end 422 correspondingly connected to one end of the connection portion 420b. In this case, the first end 421 of the third extending conductive line 420 is coupled to the second end 412 of the second extending conductive line 410 through the conductive plug V6 between the first level and the second level, and the second end 422 of the third extending conductive line 420 is coupled to the second end 402' of the first extending conductive line 400' through the conductive plug V5 between the first level and the second level.

In the embodiment, the first extending conductive line 400' substantially surrounds a center region A (for example, it is surrounded by at least one turn). Moreover, the second extending conductive line 410 partially surrounds the center region A and the corresponding first extending conductive line 400'. In the embodiment, as viewed from a top-view aspect, the connection portion 420b surrounds the center region A. Moreover, a portion 420d of the third extending conductive line 420 and a portion of the connection portion 420b are located between the first conductive line 210' and the second conductive line 220' of the first winding portion 200', and are separated from the first pair of connection layers 600' and a second pair of connection layers 620' in the second level. In the embodiment, as viewed from a top-view aspect, the surrounding configuration of the connection portion 420b of the third extending conductive line 420 is connecting the second end 402' of the first extending conductive line 400' to the second end 422 (which is referred to as one end of the connection portion 420b) of the third extending conductive line 420 through a conductive plug V5 between the first level and the second level. The connection portion 420b is located at the second level and is substantially looped in a circle to form a winding layer C1. Afterwards, the connection portion 420b is connected to the portion 420d of the third extending conductive line 420. In particular, as viewed from a top-view aspect, a portion P1 of the winding layer C1 is located between the corresponding first conductive line 210' and the corresponding second extending conductive line 410, and another portion P2 of the winding layer C1 is located between the corresponding first extending conductive line 400' and the corresponding second extending conductive line 410. Similarly, a portion 420c of the third extending conductive line 420 and a portion of the connection portion 420a are located between the first conductive line 310' and the second conductive line 320' of the second winding portion 200', and are separated from the first pair of connection layers 600' and a second pair of connection layers 620' in the second level. However, the connection portion 420a does not surround the center region A. In the embodiment, as viewed from a top-view aspect, the surrounding configuration of the connection portion 420a of the third extending conductive line 420 is connecting the second end 412 of the second extending conductive line 410 to the first end 421 (which is referred to as one end of the connection portion 420a) of the third extending conductive line 420 through a conductive plug V6 between the first level and the second level. The connection portion 420a is located at the second level and is substantially looped in a circle to form a winding layer C2. Afterwards, the connection portion 420a is connected to the portion 420c of the third extending conductive line 420. In particular, as viewed from a top-view aspect, a portion P3 of the winding layer C2 is located between the corresponding first conductive line 310' and the corresponding first extending conductive line 400', and another portion P4 of the winding layer C2 is located between the two segments (which are adjacent to and parallel to each other) of the corresponding first extending conductive line 400'.

In the embodiment, the semiconductor device further includes a guard ring 900, which is disposed in a third level (below the second level) of the insulating layer 120 and substantially surrounds the first winding portion 200' and the second winding portion 300'. In one embodiment, the guard ring 900 is electrically connected to the substrate 100 through the conductive plugs (not shown) between the substrate 100 and the third level of the insulating layer 120. It should be understood that in the various embodiments shown in FIGS. 1A, 1B, 2A, 2B, 3A, 3B, 4A, and 4B, the semiconductor devices may also include the guard ring 900 shown in FIG. 5. The guard ring 900 is disposed in a third level (below the second level) of the insulating layer 120 and substantially surrounds the first winding portion 200 and the second winding portion 300.

In a conventional on-chip inductor, the winding portions are typically disposed at the same level and surround the center region. Further, a first inductance, a second inductance and a coupling parameter are usually adjusted by changing the location where the innermost conductive line of the winding portions and the branch structure is connected. However, since the branch structure is limited to being located within a range of the side length of the innermost conductive line, such as a side length of a rectangular conductive line, the structure of the conventional on-chip inductor makes it difficult to meet various circuit-design demands.

According to the foregoing embodiments, in the semiconductor device having an inductor, the third extending conductive line (that is connected to the winding portions) and the winding portions are located at different levels. Accordingly, the first inductance and the second inductance can be increased without increasing the area occupied by the inductor. Moreover, since the first extending conductive line and the second extending conductive line are connected to the innermost conductive lines of the winding portions, the first inductance and the second inductance can be increased further without increasing the area occupied by the inductor.

Moreover, the branch structure (i.e., the third input/output portion) is disposed under the winding portions and extends from the third extending conductive line (which extends along the outermost conductive lines (e.g., the fourth conductive lines) of the winding portions. Since the third extending conductive line increases the side length of the outermost conductive line that is greater than the side length of the innermost conductive line, the tuning range for the first inductance, the second inductance and the coupling parameter can be increased, thereby improving the circuit design flexibility of the on-chip inductors so as to obtain the desired circuit features.

Moreover, the fourth conductive line of the winding portion may not overlap or may partially overlap the corresponding third extending conductive line, so as to turn the coupling parameter further. In addition, when the inductor designed according to the embodiments is connected to other circuits, the operable frequency ranges of the other circuits can be increased.

In addition, those skilled in the art will realize that the aforementioned embodiments of the invention can be implemented to two-turn or more than just four-turn inductors and the same or similar advantages can be obtained.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   an insulating layer disposed over a substrate, wherein the insulating layer has a center region;
   a first winding portion and a second winding portion electrically connected to the first winding portion, disposed in a first level of the insulating layer and surrounding the center region, wherein each of the first winding portion and the second winding portion comprises a plurality of conductive lines arranged from the inside to the outside;
   a first extending conductive line and a second extending conductive line partially surrounding the first extending conductive line, disposed in the first level of the insulating layer, wherein the first winding portion and the second winding portion surround the first extending conductive line and the second extending conductive line; and
   a third extending conductive line disposed in a second level of the insulating layer and surrounding the center region,
   wherein the extending conductive lines and the conductive lines have a first end and a second end, wherein the first end and the second end of the first extending conductive line are respectively coupled to the first end of an innermost conductive line of the second winding portion and the first end of the third extending conductive line, and the first end and the second end of the second extending conductive line are respectively coupled to the first end of an innermost conductive line of the first winding portion and the second end of the third extending conductive line, and wherein the first extending conductive line and the third extending conductive line coupled thereto are arranged in a helix or a spiral spatial configuration.

2. The semiconductor device as claimed in claim 1, wherein the conductive lines of the first winding portion and the conductive lines of the second winding portion respectively comprise a first conductive line, a second conductive line, a third conductive line, and a fourth conductive line successively arranged from the inside to the outside.

3. The semiconductor device as claimed in claim 2, wherein the fourth conductive lines extend along and overlap the third conductive line.

4. The semiconductor device as claimed in claim 2, wherein the fourth conductive lines extend along the third conductive line, and a portion of each fourth conductive line is laterally shifted with respect to a portion of the third extending conductive line.

5. The semiconductor device as claimed in claim 2, further comprising a coupling portion disposed in the first insulating layer between the first winding portion and the second winding portion, and comprising:
   a first pair of connection layers connecting the first ends of the first conductive lines to the first end of the first extending conductive line and the first end of the second extending conductive line;

a second pair of connection layers cross-connecting the first ends of the second conductive lines and the first ends of the third conductive lines;

a third pair of connection layers cross-connecting the second ends of the first conductive lines and the second ends of the second conductive lines; and a fourth pair of connection layers cross-connecting the second ends of the third conductive lines and the second ends of the fourth conductive lines.

6. The semiconductor device as claimed in claim 2, further comprising:

a first input/output portion extends outward from the first end of the outermost of the conductive lines of the first winding portion;

a second input/output portion that extends outward from the first end of the outermost of the conductive lines of the second winding portion; and a third input/output portion that extends outward from the third extending conductive line.

7. The semiconductor device as claimed in claim 1, further comprising a multi-layer interconnect structure disposed below the second level of the insulating layer, and connected to the third extending conductive line through at least two conductive plugs.

8. The semiconductor device as claimed in claim 1, further comprising a guard ring disposed in a third level below the second level of the insulating layer, surrounding the first winding portion and the second winding portion, and electrically connected to the substrate.

9. The semiconductor device as claimed in claim 1, wherein the third extending conductive line has a connection portion that loops the center region in a circle, and wherein one end of the connection portion is the first end of the third extending conductive line.

10. The semiconductor device as claimed in claim 1, wherein the third extending conductive line has a connection portion that loops in a circle, and wherein one end of the connection portion is the second end of the third extending conductive line.

\* \* \* \* \*